United States Patent
Badillo (10) Patent No.: US 7,969,209 B2
(45) Date of Patent: Jun. 28, 2011

(54) FREQUENCY DIVIDER CIRCUIT

(75) Inventor: Dean A. Badillo, Laguna Beach, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 30 days.

(21) Appl. No.: 12/416,736

(22) Filed: Apr. 1, 2009

(65) Prior Publication Data

US 2010/0253397 A1 Oct. 7, 2010

(51) Int. Cl.
*H03K 21/00* (2006.01)
*H03K 23/00* (2006.01)
*H03K 25/00* (2006.01)

(52) U.S. Cl. ........ 327/115; 327/117; 327/202; 327/203; 375/373

(58) Field of Classification Search .................. 327/115, 327/116, 117, 118, 141, 144–163, 355–360, 327/202, 203, 208–212, 218; 331/15–17; 375/373–376; 377/47, 48
See application file for complete search history.

(56) References Cited

U.S. PATENT DOCUMENTS

| | | | |
|---|---|---|---|
| 6,570,946 B1 * | 5/2003 | Homol et al. ................ | 375/371 |
| 6,845,490 B2 * | 1/2005 | Natsume ........................ | 716/1 |
| 7,035,367 B2 * | 4/2006 | Melava ......................... | 375/376 |
| 7,405,601 B2 * | 7/2008 | Garlapati et al. ............. | 327/115 |
| 7,551,009 B2 * | 6/2009 | Garlapati et al. ............. | 327/115 |
| 2001/0022537 A1 * | 9/2001 | Melava et al. ................. | 331/16 |
| 2003/0068003 A1 * | 4/2003 | Casagrande ................... | 377/47 |

* cited by examiner

*Primary Examiner* — Lincoln Donovan
*Assistant Examiner* — Brandon S Cole
(74) *Attorney, Agent, or Firm* — Knobbe, Martens Olson and Bear, LLP (57) ABSTRACT

Fractional frequency division is performed by sequentially selecting phase signals for division, where transitioning from a previous phase signal to a next phase signal for division occurs in response to not only the frequency-divided previous phase signal but also a second one of the phase signals. A phase transition that is triggered at least in part in response to a second phase signal having a phase that is greater (with respect to the phase signal sequence) than the phase of the next phase signal can aid minimization of signal glitches. The first frequency-divided signal can be further divided to produce a second frequency-divided signal having a 50-percent duty cycle.

20 Claims, 6 Drawing Sheets

FREQUENCY DIVIDER CIRCUIT

BACKGROUND

Frequency synthesis is a basic function provided on nearly every modern integrated circuit (IC). Multiple clock signals, each having a different frequency, must be generated simultaneously from a single fixed-frequency reference oscillator to meet the clocking needs of various digital and mixed-signal circuits in the IC. Frequency synthesis can be accomplished using various techniques, but the most common is to use a phase locked loop (PLL) or similar circuit. A PLL is feedback system that compares the output of a controllable oscillator to the output of a reference oscillator and uses the result of the comparison to adjust the controllable oscillator frequency upwards or downloads until the frequency difference between the controllable oscillator frequency and reference oscillator frequency is zero. The PLL can be made to output a frequency that is a multiple, N, of the controllable oscillator frequency by dividing the controllable oscillator frequency by N before the comparison with the reference oscillator frequency. For example, a stable 52 MHz clock can be synthesized from a 26 MHz reference oscillator frequency by dividing the output of the controllable oscillator by two.

If the clock signal frequencies to be synthesized are integer multiples of each other, i.e. harmonics, they can readily be generated by a single PLL in combination with one or more frequency multipliers and dividers. However, to generate clock signal frequencies that are non-harmonic or "fractional" multiples of each other, a more complex scheme is necessary. A straightforward solution is to provide a separate PLL for generating each clock signal. However, this approach is IC die area-intensive and power-intensive. Another known approach is to use a single PLL in combination with a fractional frequency divider.

Figure 1:
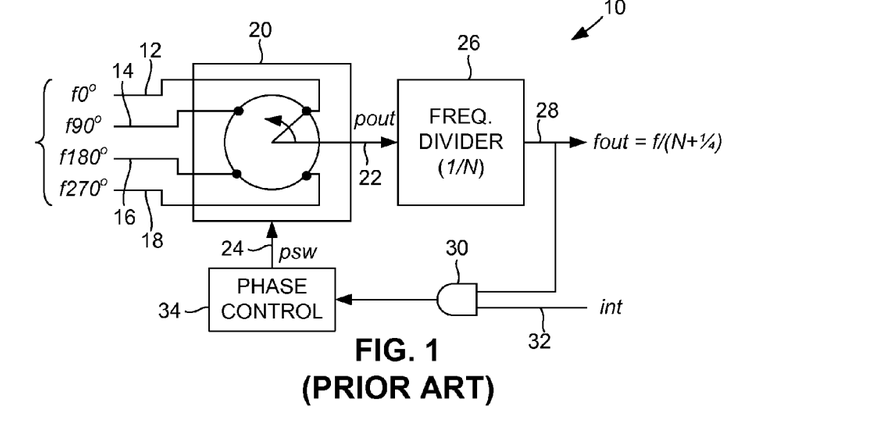
FIG. 1 is a block diagram of a fractional frequency divider system in accordance with the prior art.

Various methods of fractional frequency division are known. As illustrated in FIG. 1, a phase-switching fractional frequency divider 10 can be used in a PLL that generates clock signal frequencies that are fractional multiples of each other. For purposes of clarity, only the fractional frequency divider 10 of the PLL and not the PLL in its entirety is shown. In this example, the fractional modulus, i.e., the ratio between two non-harmonic frequencies to be synthesized, is 16.25. That is, fractional frequency divider 10 enables the PLL to generate a first clock signal having a frequency f and a second clock signal having a frequency f/16.25. Conventional phase-generator circuitry (not shown for purposes of clarity) generates a 0-degree phase signal 12 (f0°), a 90-degree phase signal 14 f90°), a 180-degree phase signal 16 (f180°), and a 270-degree phase signal 18 (f270°). That is, signals 12, 14, 16 and 18 have the same frequency f but are phase-separated in increments of 90°. All phase signals 12-18 are applied to a phase multiplexer 20, which produces a multiplexer output signal 22 (pout) in response to a multiplexer control signal 24 (psw). An integer frequency divider 26 divides the frequency of multiplexer output signal 22 by N, an integer (in this example, N=16), to produce an output signal 28 (fout). Integer frequency divider 26 commonly comprises a counter circuit. Output signal 28 is fed back into an AND gate 30, which performs a logical-AND of output signal 28 and a mode control signal 32 (int). The result of the logical-AND operation is applied to a phase controller 34, which in turn generates multiplexer control signal 24. When mode control signal 32 is high or logic-"1", phase-switching fractional frequency divider 10 operates in fractional mode, where f out=f/(N+¼).

When mode control signal 32 is low or logic-"0", phase-switching fractional frequency divider 10 operates in an integer mode, where f out=f/N.

Figure 2:
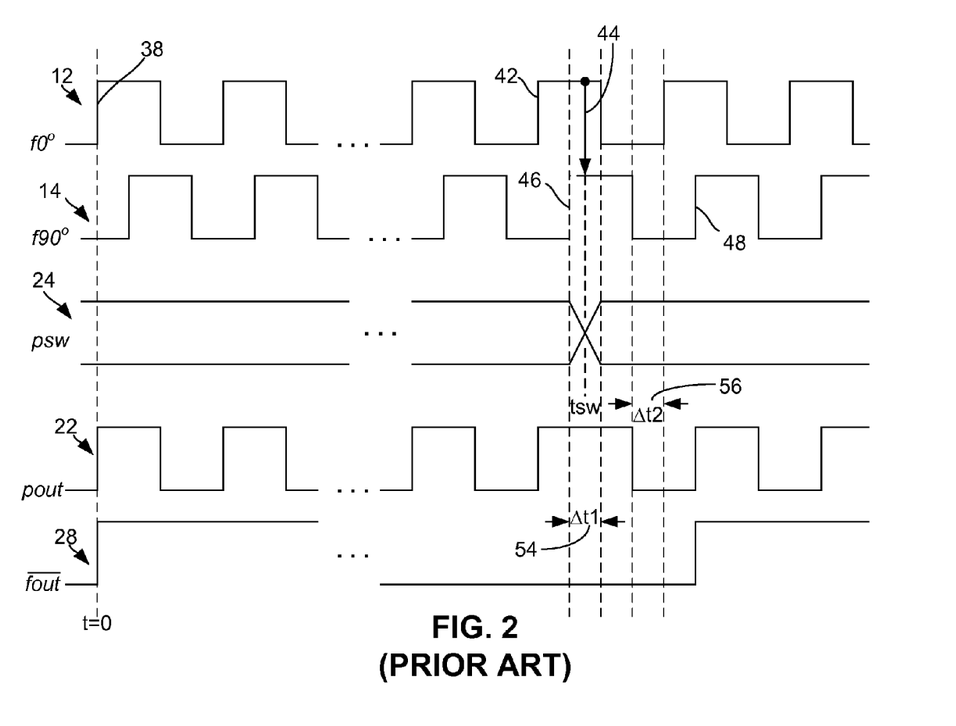
FIG. 2 is a timing diagram illustrating an example of operation of the frequency divider system of FIG. 1.

Ideally, i.e., in the absence of undesirable effects such as those caused by signal jitter and IC process variation, phase-switching fractional frequency divider 10 operates as shown in the timing diagram in FIG. 2. For purposes of clarity, only 0-degree phase signal 12 and 90-degree phase signal 14 are shown, but 180-degree phase signal 16 and 270-degree phase signal 18 are used in the same manner. In this example, in which N=16, integer frequency divider 26 is accordingly implemented as a 4-bit counter, in order to realize a fractional modulus of 16¼. The most-significant bit of the counter serves as the output of integer frequency divider 26, providing output signal 28 (fout). (Note that the complement of output signal 28 ($\overline{fout}$) is shown in FIG. 2 for purposes of clarity.)

The timing diagram of FIG. 2 begins at time t=0, with the 4-bit counter of integer frequency divider 26 (FIG. 1) in a "1111" state and phase controller 34 outputting a multiplexer control signal 24 (psw) having a value that causes phase multiplexer 20 to select zero-degree phase signal 12 (f0°). At t=0 the $0^{th}$ edge 38 of 0-degree phase signal 12 (f0°) clocks integer frequency divider 26, which places the 4-bit counter of integer frequency divider 26 in a "0000" state and causes the complement of output signal 28 ($\overline{fout}$) to transition to a high or logic-"1" state, as shown in FIG. 2. The complement of output signal 28 remains high until the $7^{th}$ edge (not shown) of zero-degree phase signal 12 (f0°). Then, at a switching time tsw, sometime after the $15^{th}$ edge 42 of zero-degree phase signal 12 (f0°), phase controller 34 increments multiplexer control signal 24 (psw) and, in response, phase multiplexer 20 selects 90-degree phase signal 14 (f90°), as indicated by the arrow 44 in FIG. 2. Because this transition occurs after the $15^{th}$ edge 46 of 90-degree phase signal 14 (f90°), edge 46 does not clock integer frequency divider 26. The next edge that clocks integer frequency divider 26 is the $0^{th}$ edge 48 of 90-degree phase signal 14 (f90°), which is delayed by ¼ of a cycle relative to zero-degree phase signal 12 (f0°). Accordingly, fout=1/(15/f+1.25/j)=f/16.25.

Figure 3:
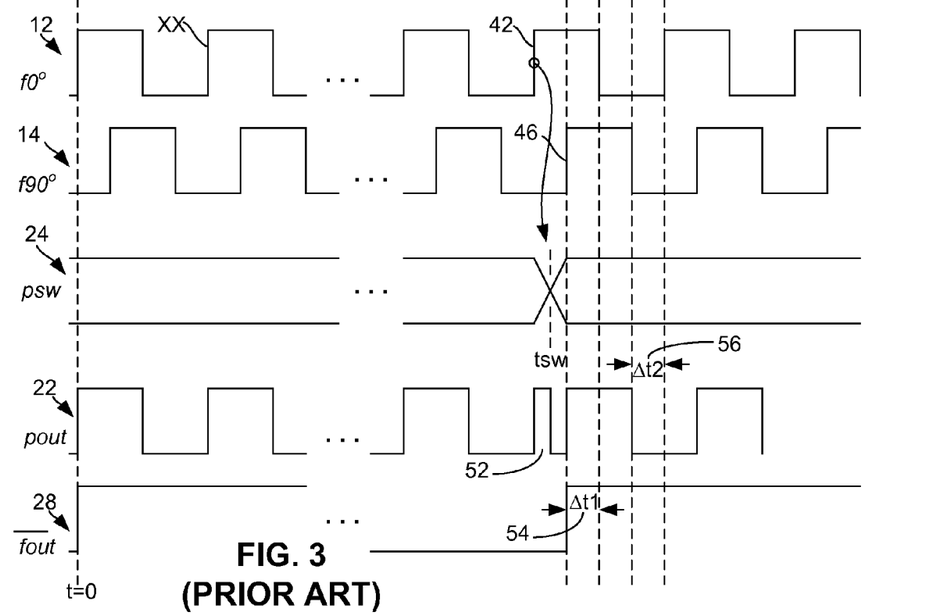
FIG. 3 is a timing diagram similar to FIG. 2, illustrating an example of operation of the frequency divider system of FIG. 1 in which undesirable signal glitches can occur.

There are two potential problems associated with phase-switching fractional frequency divider 10. First, the timing of phase multiplexer 20 transitioning or switching from one phase to the next, at time tsw, is critical. Although in the example or instance shown in FIG. 2 tsw occurs after the $15^{th}$ edge 46 of 90-degree phase signal 14 (f90°), undesirable effects caused by signal jitter, IC process variation, etc., can cause tsw in other instances to occur earlier or later than shown. Providing circuitry to compensate for such indefiniteness is problematic, as there is no signal event at tsw from which phase controller 34 could be triggered to switch multiplexer control signal 24 (psw). If tsw is too early or too late relative to the $15^{th}$ edge 46 of 90-degree phase signal 14 (f90°), glitching in multiplexer output signal 22 (pout) can occur, as illustrated in FIG. 3. As shown in this example, if the $15^{th}$ edge 42 of zero-phase signal 12 (f0°) is used to trigger phase controller 34 to switch phase multiplexer 20 from zero-degree phase signal 12 (f0°), which is in a high or logic-"1" state at time tsw, to 90-degree phase signal (f90°), which is in a low or logic-"0" state at time tsw, then multiplexer output signal 22 (pout) could include an undefined transition or glitch 52. Although not shown, a similar glitch could also arise if the transition or switching time tsw were to occur after the falling edge of zero-degree phase signal 12 (f0°). In both cases, the glitch could cause integer frequency divider 26 to produce an error in the frequency division. Such glitches can be prevented by switching phase multiplexer 20 only when both the phase from which phase multiplexer 20 is to transition and the phase to which phase multiplexer 20 is to transition are both high or both low. These safety intervals 54 ($\Delta t_1$) and 56 ($\Delta t_2$) are shown in FIGS. 2 and 3.

Another potential issue with phase-switching fractional frequency divider 10 (FIG. 1) is an undesirably asymmetric duty cycle. Many circuits, such as switched capacitor networks, require a clock having a 50-percent duty cycle to operate properly. Because the high portion of output signal 28 (fout) is 8 periods of frequency f in duration and the low portion is 8.25 periods, the duty cycle is fundamentally asymmetric.

Figure 4:
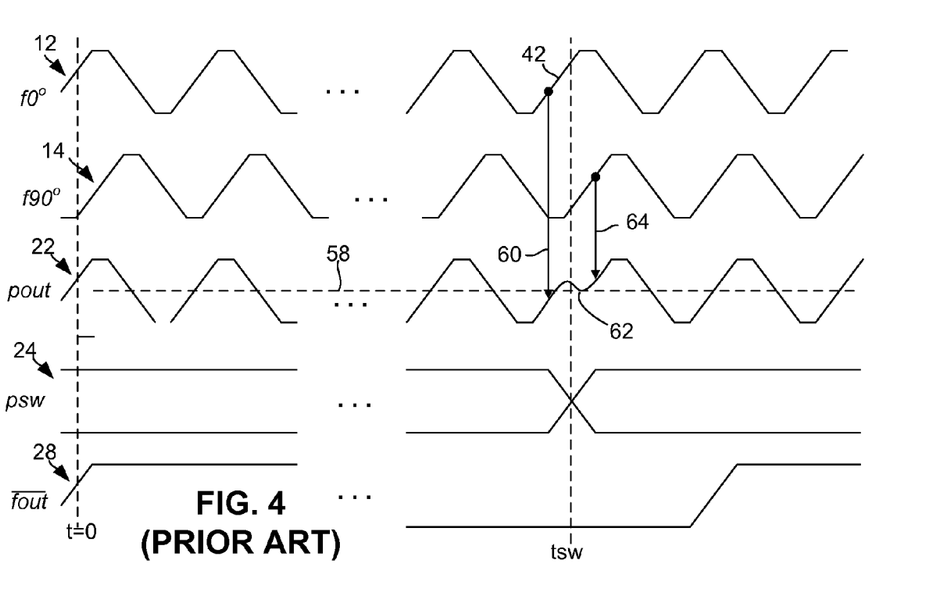
FIG. 4 is a timing diagram similar to FIG. 2, illustrating an example of operation of a prior frequency divider system similar to that shown in FIG. 1 but in which slew rates are increased to inhibit signal glitches.

One attempt to solve the above-described glitching problem is to simply slow the transition between phases. A combination of slower slew rates and signal delay reduces the magnitude of the glitch. This approach is illustrated in FIG. 4. A dashed line 58 through multiplexer output signal 22 (pout) indicates the clock signal threshold level of integer frequency divider 26, which only clocks on positive edges. If the $15^{th}$ edge 42 of zero-degree phase signal 12 (f0°) is used to trigger phase switching (as indicated by the arrow 60), a finite delay occurs before phase controller 34 increments multiplexer control signal 24 (psw) at tsw. At the time of such triggering, zero-degree phase signal 12 (f0°) has yet to reach its peak, and 90-degree phase signal 14 (f90°) is beginning to rise. The result is a gradual hand-off between phase signals, such that the rising edge of multiplexer output signal 22 (pout) exhibits a distortion 62 that is smaller and thus potentially less harmful than the glitch 52 described above with regard to FIG. 3. In the example or instance shown in FIG. 4, distortion 62 does not dip below the threshold indicated by dashed line 58 before rising again. Therefore, distortion 62 does not affect integer divider 26, which is properly clocked as the $15^{th}$ edge of 90-degree phase signal 14 (f90°) continues to rise, as indicated by the other arrow 64. Of course, the magnitude of such a distortion depends on the delay of the signals and the slew rates, which can be affected by IC manufacturing process variation, supply voltage fluctuation, etc., and are thus difficult to control with precision.

Figure 5:
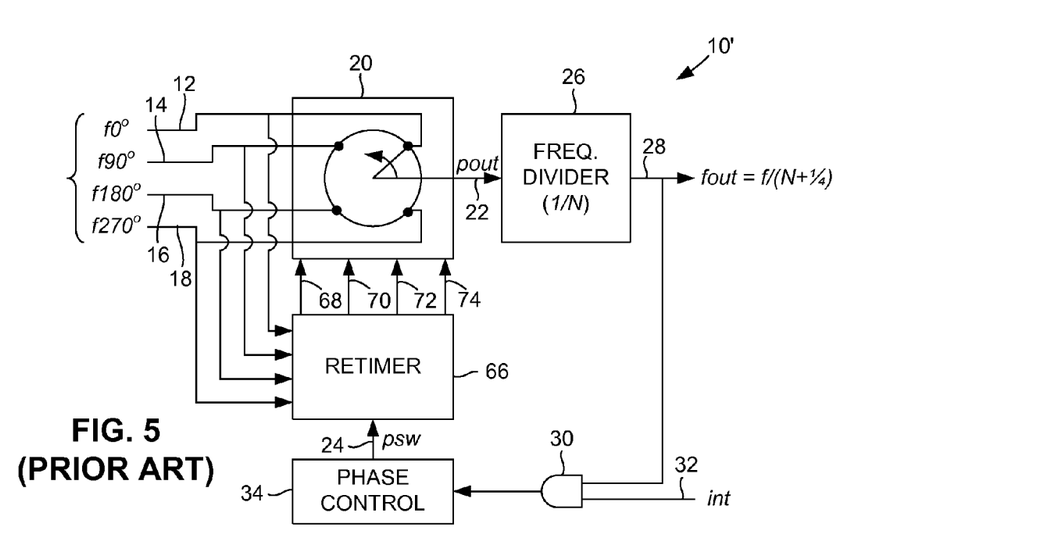
FIG. 5 is a block diagram of another fractional frequency divider system in accordance with the prior art.
Figure 6:
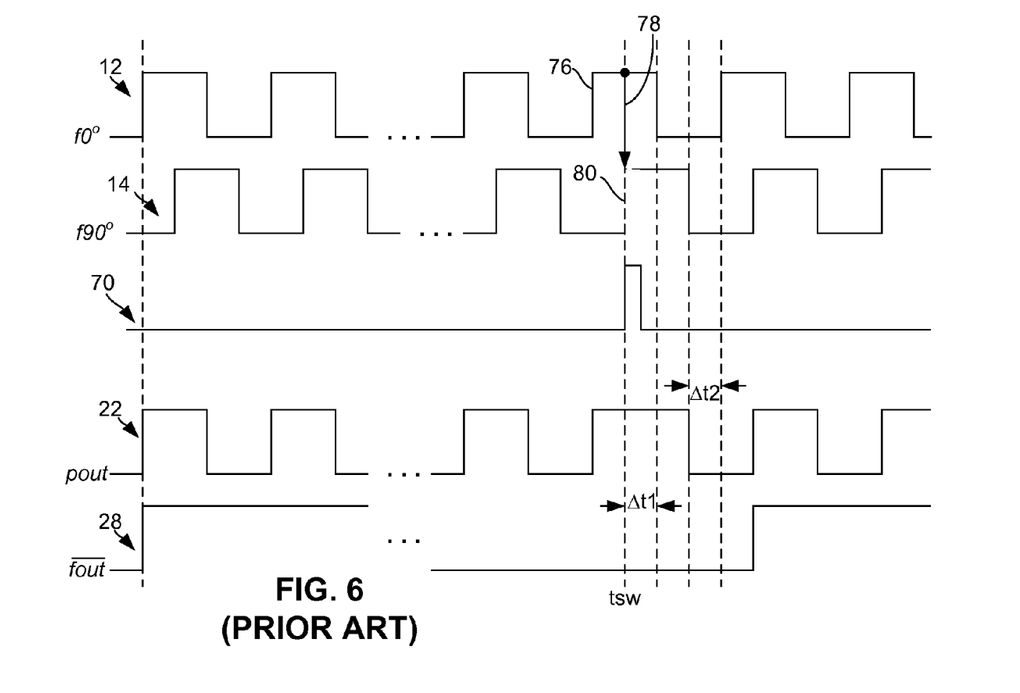
FIG. 6 is a timing diagram illustrating an example of operation of the frequency divider system of FIG. 6.

Some have attempted to solve the above-described glitching problem by synchronizing the phase switching signal with the source signals. An example of such a circuit 10' is shown in FIG. 5. In circuit 10', a retimer 66 between phase controller 34 and phase multiplexer 20 generates a 0-degree phase switching signal 68, a 90-degree phase switching signal 70, a 180-degree phase switching signal 72, and a 270-degree phase switching signal 74. As shown in FIG. 6, although phase controller 34 responds to the $15^{th}$ edge 76 of 0-degree phase signal 12 in the same manner as described above with regard to FIG. 1 (as indicated by the arrow 78), retimer 66 does not trigger 90-degree phase switching signal 70 until the $15^{th}$ edge 80 of 90-degree phase signal (f90°). The 90-degree phase switching signal 70 causes phase multiplexer 20 to switch or transition from 0-degree phase signal 12 (f0°) to 90-degree phase signal 14 (f90°). Because 0-degree phase signal 12 is in the center of its peak when switching to 90-degree phase signal 14 occurs no glitch will occur (at least under ideal conditions; however, glitching is possible in instances in which noise, delay or other factors distort or skew the waveforms from the ideal squarewaves shown in this example). Although this scheme anchors tsw to a well-controlled signal edge, it does not address the above-described problem of an asymmetric duty cycle.

SUMMARY

Embodiments of the invention relate to fractional frequency division by sequentially selecting phase signals for division, where transitioning from a previous phase signal to a next phase signal for division occurs in response to not only the frequency-divided previous phase signal but also a second one of the phase signals. Embodiments of the invention can further divide the (first) frequency-divided signal to produce a second frequency-divided signal.

In an exemplary frequency divider system, a phase multiplexer transitions its output from the previous phase signal to a selected first phase signal in response to a phase select signal. A second one of the plurality of phase signals is also selected. A first frequency divider divides the phase multiplexer output to produce a first frequency-divided signal. The phase select signal is produced in response to the first frequency-divided signal and the selected second phase signal. A phase transition that is triggered at least in part in response to a second phase signal having a phase that is greater (with respect to the phase signal sequence) than the phase of the next phase signal to which the multiplexer output is to transition promotes minimization of signal glitches. In embodiments having a second frequency divider, the output of the first frequency divider is further divided to produce the second frequency-divided signal.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 7:
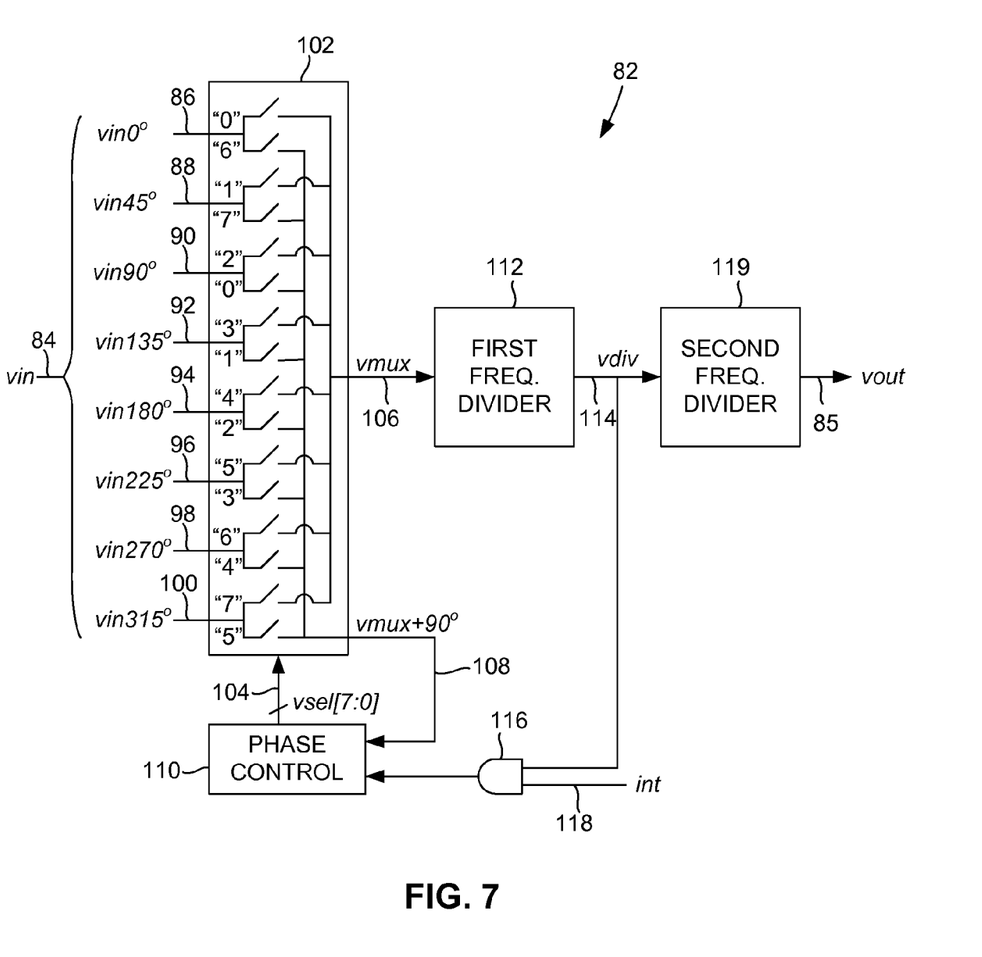
FIG. 7 is a block diagram of a fractional frequency divider system in accordance with the present invention.

As illustrated in FIG. 7, in accordance with an illustrative or exemplary embodiment of the invention, a phase-switching fractional frequency divider 82 can divide an input signal 84 (vin) having a frequency f by a fractional, i.e., non-integer, ratio or modulus, to produce an output signal 85 (vout). Although in the embodiment described herein the fractional modulus is 16.25, in other examples it can be any other number. Although the fractional modulus can be any suitable number, division of a clock signal by 16.25 is described with regard to the exemplary embodiment because it may be useful in an instance in which certain digital circuitry of a wireless telephone handset (not shown) operates at 1248 MHz, but the Wideband Code Division Multiple Access (WCDMA) standard specifies analog-to-digital conversion at 76.8 MHz. Phase-switching fractional frequency divider 82 can be used in such a handset to produce a 76.8 MHz clock signal by dividing a 1248 MHz clock signal by 16.25. However, in other embodiments the fractional modulus can be any other suitable number.

In the exemplary embodiment, conventional phase-generator circuitry of a type well understood in the art (and thus not shown for purposes of clarity) generates eight signals having the same frequency f as a reference signal 84 (vin) but differing in phase from one another: a 0-degree phase signal 86 (vin0°), a 45-degree phase signal 88 (vin45°), a 90-degree phase signal 90 (vin90°), a 135-degree phase signal 92 (vin135°), a 180-degree phase signal 94 (vin180°), a 225-degree phase signal 96 (vin225°), a 270-degree phase signal 98 (vin270°), and a 315-degree phase signal 100 (vin315°). That is, phase signals 86-100 have the same frequency f but they define a sequence in which the phase increments by 45° from one phase signal in the sequence to the next. A phase multiplexer 102 receives each of phase signals 86-100 and, in response to a phase selection signal 104 (vsel), produces a first multiplexer output signal 106 (vmux) and a second multiplexer output signal 108 (vmux+90). That is, phase multiplexer 102 passes or routes a selected first one of phase signals 86-100 to a first multiplexer output and a selected second one of phase signals 86-100 to a second multiplexer output. It should be noted that each of these two outputs of multiplexer 102 switches or transitions from a previously selected one of phase signals 86-100 to another one of phase signals 86-100 upon a change in phase control signal 104.

In the exemplary embodiment, phase multiplexer 102 comprises eight groups of two single-pole, single-throw switching devices, which can be implemented with tri-state inverters or other suitable switching circuitry. Each group corresponds to one of the phase signals 86-100. In each group, the first terminal of the first switching device is connected to the first terminal of the second switching device and receives the corresponding one of phase signals 86-100. The second terminal of the first switching device in each group is connected to the second terminal of the first switching device in every other group and provides first multiplexer output signal 106 (vmux). Likewise, the second terminal of the second switching device in each group is connected to the second terminal of the second switching device in every other group and provides second multiplexer output signal 108 (vmux+90).

As described below, a phase controller 110 generates phase selection signal 104 (vsel). Phase selection signal 104 can assume any of eight values, "0"-"7". In FIG. 7, the switching devices of phase multiplexer 102 are labeled with "0"-"7" to indicate the following operation in the exemplary embodiment: In response to phase selection signal 104 having a value of "0", phase multiplexer 102 closes the first switching device of the first group and the second switching device of the third group and opens the remaining switching devices. In response to phase selection signal 104 having a value of "1", phase multiplexer 102 closes the first switching device of the second group and the second switching device of the fourth group and opens the remaining switching devices. In response to phase selection signal 104 having a value of "2", phase multiplexer 102 closes the first switching device of the third group and the second switching device of the fifth group and opens the remaining switching devices. In response to phase selection signal 104 having a value of "3", phase multiplexer 102 closes the first switching device of the fourth group and the second switching device of the sixth group and opens the remaining switching devices. In response to phase selection signal 104 having a value of "4", phase multiplexer 102 closes the first switching device of the fifth group and the second switching device of the seventh group and opens the remaining switching devices. In response to phase selection signal 104 having a value of "5", phase multiplexer 102 closes the first switching device of the sixth group and the second switching device of the eighth group and opens the remaining switching devices. In response to phase selection signal 104 having a value of "6", phase multiplexer 102 closes the second switching device of the first group and the first switching device of the seventh group and opens the remaining switching devices. In response to phase selection signal 104 having a value of "7", phase multiplexer 102 closes the second switching device of the second group and the first switching device of the eighth group and opens the remaining switching devices. It can thus be observed that each time phase select signal 104 is incremented the phase of first multiplexer output signal 106 (vmux) is incremented by 45 degrees and the phase of second multiplexer output signal (vmux+90), which leads or is greater than first multiplexer output signal 106 by 90 degrees, is also incremented by 45 degrees.

A first frequency divider 112 divides the frequency of first multiplexer output signal 106 by eight to produce a first frequency-divided signal 114 (vdiv). Although in this exemplary embodiment the division ratio or divisor is eight, in other embodiments it can be any other integer that is one-half the integer portion of the fractional modulus by which fractional frequency divider 82 is to divide. In this example, as the fractional modulus is 16.25, the integer portion of which is 16, first frequency divider 112 divides by one-half of 16 or eight. First frequency-divided signal 114 (vdiv) is coupled to an input of phase controller 110 via suitable coupling logic such as an AND gate 116, which combines first frequency-divided signal 114 with a mode control signal 118 (int). When mode control signal 118 is high or logic-"1", indicating the fractional-division mode, phase controller 110 responds to a transition (e.g., rising signal edge) in first frequency-divided signal 114 by incrementing phase select signal 110 (in a modulo-7 manner, i.e., 0, 1, 2, 3, 4, 5, 6, 7, 0, . . .). When mode control signal 118 is low or logic-"0", phase-switching fractional frequency divider 82 operates in the integer-division mode, dividing input signal 84 (vin) by 16.

A second frequency divider 119 further divides first frequency-divided signal 114 by two in the exemplary embodiment to produce output signal 85 (vout) as a second frequency-divided signal. Dividing by two ensures that output signal 85 has a 50-percent duty cycle, which is desirable in many instances. Second frequency divider 119 can comprise a single toggle flip-flop or any other suitable divide-by-two circuitry.

Figure 8:
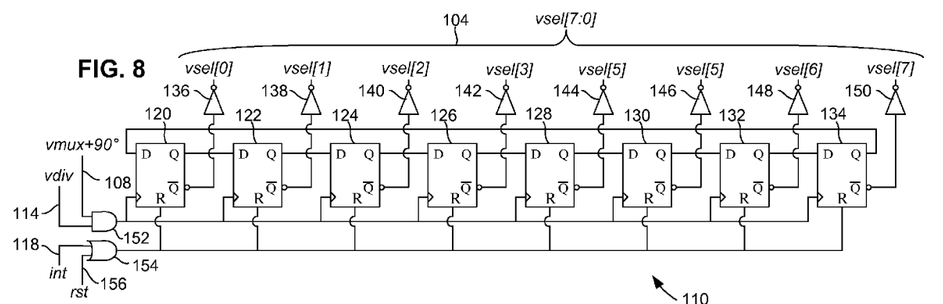
FIG. 8 is a block diagram of the phase controller portion of the fractional frequency divider system of FIG. 5.

Phase controller 110 of the exemplary embodiment is shown in further detail in FIG. 8. Phase controller 110 comprises eight flip-flops 120, 122, 124, 126, 128, 130, 132 and 134, arranged in a ring. That is, the non-inverted output (Q) of each of flip-flops 120-134 is coupled to the input (D) of the next one of flip-flops 120-134 in the ring. The inverted output (Q̄) of each of flip-flops 120-134 is coupled to a corresponding inverter 136, 138, 140, 142, 144, 146, 148 and 150, which inverts the signal to produce a portion of phase select signal 104. Although in this embodiment phase select signal 104 comprises eight separate signals or bits vsel[7:0], each of which phase multiplexer 102 uses to operate a pair of the switching devices, in other embodiments any other scheme can be used for signaling the phase selection. Each of flip-flops 120-134 is clocked by a signal provided by an AND gate 152, which combines first frequency-divided signal 114 (vdiv) and second multiplexer output signal 108 (vmux+90). Each of flip-flops 120-134 is reset (R) by a signal provided by an OR gate 154, which combines mode control signal 118 (int) with a reset signal 156.

The ring topology of phase controller 110 ensures that the switching of one phase signal on and another phase signal off occurs at substantially the same instant. To balance the loading, the phase select signal 104 is formed from the inverting outputs ($\overline{Q}$) of flip-flops 120-134, while the non-inverted output (Q) of each of flip-flops 120-134 drives the input (D) of the next one of flip-flops 120-134 in the ring. When reset signal 156 (rst) is asserted, phase select signal 104 (vsel) is reset to a state of vsel[7:0]="00000001", thus causing phase multiplexer 102 to pass 0-degree phase signal 86 (vin0°) as first multiplexer output signal 106 and pass 90-degree phase signal 90 (vin90°) as second multiplexer output signal 108 (vmux+90°). If mode control signal 118 (int) is low or logic-"0", this state is held regardless of any change in second multiplexer output signal 108 (vmux+90°) or first frequency-divided signal 114 (vdiv). If mode control signal 118 (int) is high or logic-"1", then the "1" is shifted whenever the result of the logical-AND of second multiplexer output signal 108 (vmux+90°) and first frequency-divided signal 114 (vdiv) transitions to high or logic-"1". In other words, when second multiplexer output signal 108 (vmux+90°) AND first frequency-divided signal 114 (vdiv) transitions to high or logic-"1", phase select signal 104 (vsel[7:0]) becomes "00000010". Since second multiplexer output signal 108 is delayed a quarter of a cycle relative to first frequency-divided signal 114, phase select signal 104 is effectively synchronized to second multiplexer output signal 108.

Figure 9:
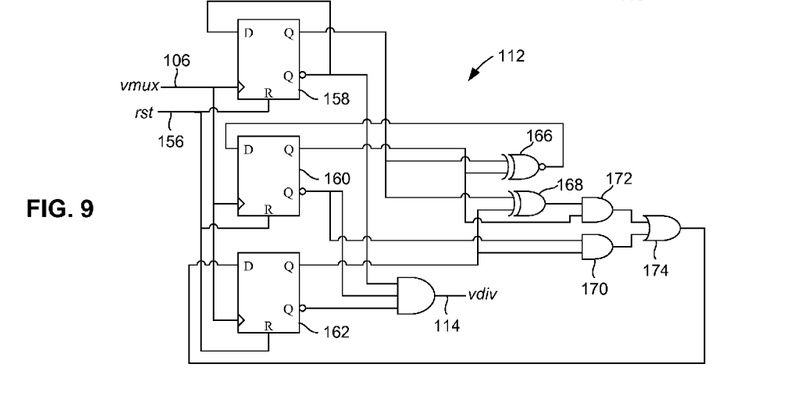
FIG. 9 is a block diagram of the first frequency divider portion of the fractional frequency divider system of FIG. 7.

First frequency divider 112 of the exemplary embodiment is shown in further detail in FIG. 9. First frequency divider 112 comprises three flip-flops 158, 160 and 162 arranged to form a 3-bit counter that divides first multiplexer output signal 106 (vmux) by eight to produce first frequency-divided signal 114 (vdiv). The output (i.e., first frequency-divided signal 114) is provided by an AND gate 164 that combines the inverted outputs ($\overline{Q}$) of flip-flops 158, 160 and 162. The non-inverted output (Q) of flip-flop 156 is fed back to the input (D) of flip-flop 156. An exclusive-NOR gate 166 combines the non-inverted (Q) outputs of flip-flops 158 and 160 and feeds the result back to the input (D) of flip-flop 160. An exclusive-OR gate 168 combines the non-inverted (Q) output of flip-flop 156 and 162. An AND gate 170 combines the inverted output (Q) of flip-flop 160 and the non-inverted output (Q) of flip-flop 162. Another AND gate 172 combines the output of exclusive-OR gate 168 and the non-inverted output of flip-flop 160. An OR gate 174 combines the outputs of AND gates 170 and 172 and feeds the result back to the input (D) of flip-flop 162. All three flip-flops 158, 160 and 162 receive the same reset signal 156 that is provided to phase controller 110 (FIG. 8). Upon assertion of reset signal 156, the counter assumes a "000" state, i.e., the non-inverting output (D) of each of flip-flops 158, 160 and 162 is high or logic-"1". When the counter is in the "000" state, first multiplexer output signal 106 (vmux) is high or logic-"1". The counter increments (e.g., from "000" to "001," etc.) on each positive edge of first multiplexer output signal 106. After eight such transitions of first multiplexer output signal 106, the counter assumes a "000" state first multiplexer output signal 106 is only high or logic-"1" when the counter is in the "000" state.

Figure 10:
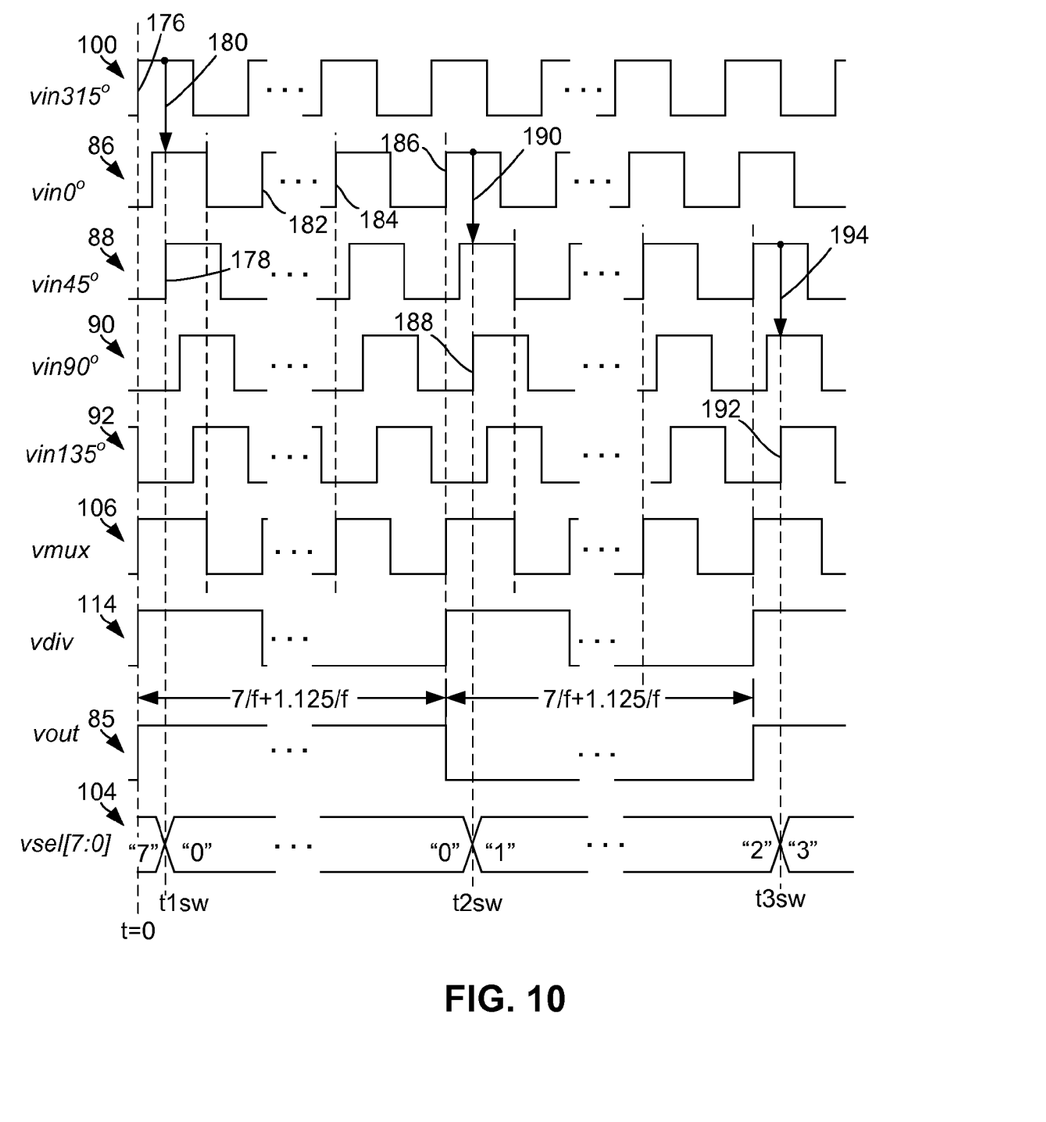
FIG. 10 is a timing diagram illustrating an example of operation of the frequency divider system of FIG. 7.

The operation of fractional frequency divider 82 is illustrated with further reference to the timing diagram of FIG. 10. Note that only five of the eight phase signals are shown for purposes of clarity. At time t=0, first multiplexer output signal 106 (vmux) is 315-degree phase signal 100 (vin315°), second multiplexer output signal 108 (vmux+90°) is 45-degree phase signal 88 (vin45°), and first frequency divider 112 is in the "111" state. At time t1sw, the $0^{th}$ edge 176 of 315-degree phase signal 100 (vin315°) clocks first frequency divider 112 and sets first frequency-divided signal 114 (vdiv) and output signal 85 (vout), i.e., the second frequency-divided signal, high or logic-"1". Since mode control signal 118 (int) is high or logic-"1", the output of AND gate 116 is also high, and thus phase controller 110 is enabled. At time t1sw, the $0^{th}$ edge 178 of 45-degree phase signal 88 (vin45°) increments phase select signal 104 (vsel), selecting 0-degree phase signal 86 (vin0°) as first multiplexer output signal 106 (vmux) and selecting 90-degree phase signal 90 (vin90°) as second multiplexer output signal 108 (vmux+90°). The transition of first multiplexer output signal 106 (vmux) from 315-degree phase signal 100 (vin315°) to 0-degree phase signal 86 (vin0°) is indicated by the downward arrow 180. First frequency-divided signal 114 (vdiv) remains high until the next rising edge 182 of 0-degree phase signal 86 (vin0°). First frequency divider 112 continues to be clocked by 0-degree phase signal 86 (vin0°) through the $7^{th}$ edge 184, i.e., the last edge before the next $0^{th}$ edge 186. Upon that $0^{th}$ edge 186 of 0-degree phase signal 86 (vin0°), first frequency-divided signal 114 (vdiv) is set high, which sets output signal 85 (vout) low. Because first multiplexer output signal 106 (vmux) is a repeating signal of seven 1/f cycles and one 1.125/f cycle, the frequency of first frequency-divided signal 114 (vdiv) is:

$$f_{vdiv} = \frac{1}{t2_{sw} - t1_{sw}} = 7x\frac{1}{f_{vin}} + \frac{1.125}{f_{vin}} = \frac{f_{vin}}{8.125} \quad (1)$$

Therefore, the frequency of output signal 85 (vout), i.e., the second frequency-divided signal, is:

$$f_{vout} = \frac{f_{vdiv}}{2} = \frac{f_{vin}}{16.25} \quad (2)$$

(Note that apart from equations (1) and (2) above, $t1_{sw}$ and $t2_{sw}$ are represented herein by "t1sw" and "t2sw" for readability.) Also, because first frequency-divided signal 114 (vdiv) is divided by two to achieve the final divide ratio of 16.25, a 50-percent duty cycle is ensured for output signal 85 (vout), i.e., the second frequency-divided signal.

The above-described sequence repeats at time t2sw, when the $0^{th}$ edge 188 of 90-degree phase signal 90 (vin90°) increments phase select signal 104 (vsel), selecting 45-degree phase signal 88 (vin45°) as first multiplexer output signal 106 (vmux) and selecting 135-degree phase signal 92 (vin135°) as second multiplexer output signal 108 (vmux+90°). The transition of first multiplexer output signal 106 (vmux) from 0-degree phase signal 86 (vin0°) to 45-degree phase signal 88 (vin45°) is indicated by the downward arrow 190. Similarly, the sequence repeats again at time t3sw, when the $0^{th}$ edge 192 of 135-degree phase signal 135 (vin135°) increments phase select signal 104 (vsel), selecting 90-degree phase signal 90 (vin90°) as first multiplexer output signal 106 (vmux) and selecting 180-degree phase signal 94 (not shown in FIG. 10) as second multiplexer output signal 108 (vmux+90°). The transition of first multiplexer output signal 106 (vmux) from 45-degree phase signal 88 (vin45°) to 90-degree phase signal 90 (vin90°) is indicated by the downward arrow 194.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A frequency divider system, comprising:
   a phase multiplexer, the phase multiplexer receiving a plurality of phase signals having sequentially increasing phases, each phase signal of the plurality of phase signals having a phase different from every other phase of the plurality of phase signals, the phase multiplexer, in response to a phase select signal, selecting a first one of the plurality of phase signals and a second one of the plurality of phase signals that is non-complementary to the first one of the plurality of phase signals and transitioning a phase multiplexer output from a previous one of the plurality of phase signals to the selected first one of the plurality of phase signals;
   a first frequency divider, the first frequency divider producing a first frequency-divided signal in response to the phase multiplexer output; and
   a phase controller, the phase controller receiving the first frequency-divided signal and a non-frequency-divided signal defined by the second one of the plurality of phase signals bypassing the first frequency divider, the phase controller producing the phase select signal in response to the first frequency-divided signal and the non-frequency-divided signal, a transition of the second one of the plurality of phase signals triggering the phase controller to produce the phase select signal.

2. The frequency divider system claimed in claim 1, wherein:
   the phase of the first one of the plurality of phase signals is greater than the phase of the previous one of the plurality of phase signals; and
   the phase of the second one of the plurality of phase signals is greater than the phase of the first one of the plurality of phase signals.

3. The frequency divider system claimed in claim 1, wherein:
   the sequentially increasing phases increase by an increment;
   the phase of the first one of the plurality of phase signals is greater than the phase of the previous one of the plurality of phase signals by the increment;
   the phase of the second one of the plurality of phase signals is greater than the phase of the previous one of the plurality of phase signals by twice the increment.

4. The frequency divider system claimed in claim 3, wherein the increment is 45 degrees, and the plurality of phase signals consist of a zero-degree phase signal, a 45-degree phase signal, a 90-degree phase signal, a 135-degree phase signal, a 180-degree phase signal, a 225-degree phase signal, a 270-degree phase signal, and a 315-degree phase signal.

5. The frequency divider system claimed in claim 1, wherein:
   the phase controller comprises a plurality of flip-flops connected to one another in a ring, with an output of each flip-flop connected to an input of a succeeding flip-flop in the ring; and
   the phase multiplexer comprises a plurality of switching devices, and each switching device operates in response to a signal produced by a flip-flop of the phase controller.

6. The frequency divider system claimed in claim 1, further comprising a second frequency divider, the second frequency divider producing a second frequency-divided signal in response to the first frequency-divided signal.

7. The frequency divider system claimed in claim 6, wherein the first frequency divider is a divide-by-eight frequency divider, and the second frequency divider is a divide-by-two frequency divider, whereby a total divide ratio is 16.25.

8. The frequency divider system claimed in claim 6, wherein:
   the phase of the first one of the plurality of phase signals is greater than the phase of the previous one of the plurality of phase signals; and
   the phase of the second one of the plurality of phase signals is greater than the phase of the first one of the plurality of phase signals.

9. The frequency divider system claimed in claim 8, wherein:
   the sequentially increasing phases increase by an increment;
   the phase of the first one of the plurality of phase signals is greater than the phase of the previous one of the plurality of phase signals by the increment;
   the phase of the second one of the plurality of phase signals is greater than the phase of the previous one of the plurality of phase signals by twice the increment.

10. The frequency divider system claimed in claim 9, wherein:
    the increment is 45 degrees, and the plurality of phase signals consist of a zero-degree phase signal, a 45-degree phase signal, a 90-degree phase signal, a 135-degree phase signal, a 180-degree phase signal, a 225-degree phase signal, a 270-degree phase signal, and a 315-degree phase signal; and
    the first frequency divider is a divide-by-eight frequency divider, and the second frequency divider is a divide-by-two frequency divider, whereby a total divide ratio is 16.25.

11. A method of operation of a frequency divider system, comprising:
    transitioning a phase multiplexer output from a previous one of a plurality of phase signals to a selected first one of the plurality of phase signals in response to a phase select signal, the plurality of phase signals having sequentially increasing phases, each phase signal of the plurality of phase signals having a phase different from every other phase of the plurality of phase signals;
    selecting a second one of the plurality of phase signals that is non-complementary to the first one of the plurality of phase signals;
    dividing the phase multiplexer output to produce a first frequency-divided signal; and
    producing the phase select signal in response to the first frequency-divided signal and a non-frequency-divided signal defined by the selected second one of the plurality of phase signals.

12. The method claimed in claim 11, wherein:
the phase of the first one of the plurality of phase signals is greater than the phase of the previous one of the plurality of phase signals; and
the phase of the second one of the plurality of phase signals is greater than the phase of the first one of the plurality of phase signals.

13. The method claimed in claim 12, wherein:
the sequentially increasing phases increase by an increment;
the phase of the first one of the plurality of phase signals is greater than the phase of the previous one of the plurality of phase signals by the increment;
the phase of the second one of the plurality of phase signals is greater than the phase of the previous one of the plurality of phase signals by twice the increment.

14. The method claimed in claim 13, wherein the increment is 45 degrees, and the plurality of phase signals consist of a zero-degree phase signal, a 45-degree phase signal, a 90-degree phase signal, a 135-degree phase signal, a 180-degree phase signal, a 225-degree phase signal, a 270-degree phase signal, and a 315-degree phase signal.

15. The method claimed in claim 11, further comprising dividing the first frequency-divided signal to produce a second frequency-divided signal.

16. The method claimed in claim 15, wherein the first frequency divider is a divide-by-eight frequency divider, and the second frequency divider is a divide-by-two frequency divider, whereby a total divide ratio is 16.25.

17. The method claimed in claim 15, wherein:
the phase of the first one of the plurality of phase signals is greater than the phase of the previous one of the plurality of phase signals; and
the phase of the second one of the plurality of phase signals is greater than the phase of the first one of the plurality of phase signals.

18. The method claimed in claim 17, wherein:
the sequentially increasing phases increase by an increment of 45 degrees; and
the plurality of phase signals consists of a zero-degree phase signal, a 45-degree phase signal, a 90-degree phase signal, a 135-degree phase signal, a 180-degree phase signal, a 225-degree phase signal, a 270-degree phase signal, and a 315-degree phase signal.

19. The method claimed in claim 18, wherein the first frequency divider is a divide-by-eight frequency divider, and the second frequency divider is a divide-by-two frequency divider, whereby a total divide ratio is 16.25.

20. A frequency divider system, comprising:
a phase multiplexer, the phase multiplexer receiving a plurality of phase signals having sequentially increasing phases, each phase signal of the plurality of phase signals having a phase different from every other phase of the plurality of phase signals, the phase multiplexer, in response to a phase select signal, selecting a first one of the plurality of phase signals and a second one of the plurality of phase signals that is non-complementary to the first one of the plurality of phase signals and transitioning a phase multiplexer output from a previous one of the plurality of phase signals to the selected first one of the plurality of phase signals, wherein the sequentially increasing phases increase by an increment, the phase of the first one of the plurality of phase signals is greater than the phase of the previous one of the plurality of phase signals by the increment, and the phase of the second one of the plurality of phase signals is greater than the phase of the previous one of the plurality of phase signals by twice the increment;
a first frequency divider, the first frequency divider producing a first frequency-divided signal in response to the phase multiplexer output; and
a phase controller, the phase controller receiving the first frequency-divided signal and a non-frequency-divided signal defined by the second one of the plurality of phase signals bypassing the first frequency divider, the phase controller producing the phase select signal in response to the first frequency-divided signal and the non-frequency-divided signal, a transition of the second one of the plurality of phase signals triggering the phase controller to produce the phase select signal; and
a second frequency divider, the second frequency divider dividing the first frequency-divided signal by two to produce a second frequency-divided signal having a 50 percent duty cycle.

* * * * *